(12) United States Patent
Ryu (10) Patent No.: US 11,183,089 B2
(45) Date of Patent: Nov. 23, 2021

(54) DISPLAY DEVICE AND CRACK INSPECTION METHOD THEREOF

(71) Applicant: SAMSUNG DISPLAY CO., LTD., Yongin-si (KR)

(72) Inventor: Do Hyung Ryu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 249 days.

(21) Appl. No.: 16/191,092

(22) Filed: Nov. 14, 2018

(65) Prior Publication Data

US 2019/0285691 A1 Sep. 19, 2019

(30) Foreign Application Priority Data

Mar. 19, 2018 (KR) .................. 10-2018-0031658

(51) Int. Cl.
*G09G 3/00* (2006.01)
*G01R 31/28* (2006.01)

(52) U.S. Cl.
CPC ......... *G09G 3/006* (2013.01); *G01R 31/2825* (2013.01); *G09G 3/035* (2020.08)

(58) Field of Classification Search
CPC ............ G01R 31/2825; G09G 3/006; G09G 2310/0264; G09G 2380/02
USPC .................................................... 324/750.3
See application file for complete search history.

(56) References Cited

U.S. PATENT DOCUMENTS

| 5,113,134 A * | 5/1992 | Plus .................. G09G 3/006 |
| | | 324/750.3 |
| 9,887,386 B2 | 2/2018 | Park et al. |
| 9,990,873 B2 * | 6/2018 | Jang .................. G09G 3/3225 |
| 2014/0354286 A1 * | 12/2014 | Kim .................. G09G 3/006 |
| | | 324/414 |
| 2015/0008937 A1 * | 1/2015 | Lee .................. G09G 3/006 |
| | | 324/539 |
| 2015/0243225 A1 * | 8/2015 | Maeyama ............ G09G 3/3406 |
| | | 345/691 |
| 2016/0117974 A1 * | 4/2016 | Back .................. G09G 3/3275 |
| | | 345/213 |
| 2016/0226024 A1 * | 8/2016 | Park .................. H01L 51/5253 |
| 2016/0266702 A1 * | 9/2016 | Yang .................. G09G 3/3241 |

FOREIGN PATENT DOCUMENTS

KR 10-2016-0095312 8/2011

* cited by examiner

*Primary Examiner* — Jeff W Natalini
(74) *Attorney, Agent, or Firm* — F. Chau & Associates, LLC (57) ABSTRACT

A display device includes a display panel having a plurality of pixels and a driving circuit. A plurality of driving lines electrically connects the driving circuit to the display panel and supplies driving signals from the driving circuit to the display panel. A switching unit connects each of the plurality of driving lines to a first end of an inspection line. An inspection circuit is connected to a second end of the inspection line. A line selection unit is configured to selectively connect one or more of the plurality of driving lines to the inspection circuit through the inspection line.

17 Claims, 6 Drawing Sheets

DISPLAY DEVICE AND CRACK INSPECTION METHOD THEREOF

CROSS-REFERENCE TO RELATED APPLICATION

This application claims priority to and the benefit of Korean Patent Application No. 10-2018-0031658 filed in the Korean Intellectual Property Office on Mar. 19, 2018, the entire contents of which are herein incorporated by reference.

TECHNICAL FIELD

The present invention relates to a display device and, more specifically, to a display device and a crack inspection method thereof.

DISCUSSIONS OF THE RELATED ART

A display device may include a display panel on which a plurality of pixels are formed, and a driving circuit electrically connected to the display panel through driving lines. The display device may supply driving signals to the driving lines for driving the plurality of pixels. The driving circuit may be formed as a chip and the chip may be mounted on a flexible printed circuit board (FPCB).

The display device may include a bending region in which a portion of the flexible printed circuit board is bent. By bending back the bending region, a noticeable size of a bezel region of the display device may be reduced. However, as a result of the bending, cracks may occur in the driving lines disposed in the bending region.

SUMMARY

A display device includes a display panel having a plurality of pixels and a driving circuit. A plurality of driving lines electrically connects the driving circuit to the display panel and supplies driving signals from the driving circuit to the display panel. A switching unit connects each of the plurality of driving lines to a first end of an inspection line. An inspection circuit is connected to a second end of the inspection line. A line selection unit is configured to selectively connect one or more of the plurality of driving lines to the inspection circuit through the inspection line.

A crack inspection method of a display device includes connecting a plurality of driving lines to an inspection line. A sensing signal is supplied to at least one of the plurality of driving lines connected to the inspection line. A sensing value corresponding to the sensing signal is detected from the inspection line. The detected sensing value is compared with a stored reference value. It is determined whether the at least one of the plurality of driving lines is abnormal based on a result of the comparison.

A display device includes a display panel including a plurality of pixels. A scan driver supplies a plurality of scan signals to the plurality of pixels along a plurality of scan lines. A data driver supplies a plurality of data signals to the plurality of pixels along a plurality of data lines. The data driver is disposed on a connector that includes a bending portion though which each of the plurality of data lines passes. The connector further includes a driving circuit configured to generate the plurality of data signals, an inspection circuit configured to determine whether each of the plurality of data lines are cracked within the bending region, and a switching unit for connecting the inspection circuit to each of the plurality of data lines.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

It will be apparent to those skilled in the art that various modifications and variations can be made in the present disclosure without departing from the spirit or scope of the disclosure, and specific exemplary embodiments are exemplified in the drawings and explained in the detailed description. Thus, it is intended that the present invention covers all technical equivalents which operate in a similar manner.

Like reference numerals may designate like elements throughout the specification. In the accompanying drawings, dimensions of structures may be exaggerated for clarity. The terms, 'first', 'second' and the like may be simply used for description of various constituent elements and it is to be understood that this numbering carries no special significance other than to identify the constituent elements from each other and the numbering may be changed. For example, a first constituent element may be referred to as a second constituent element and similarly, the second constituent element may be referred to as the first constituent element within the scope of the present disclosure. When explaining the singular, unless explicitly described to the contrary, it may be interpreted as the plural meaning.

In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and may include a side direction or a lower direction. Moreover, it will be understood that when an element such as a layer, film, region, or substrate is referred to as being "beneath" another element, it can be directly beneath the other element or intervening elements may also be present.

Hereinafter, exemplary embodiments of the present invention will be described in further detail with reference to the accompanying drawings.

Figure 1:
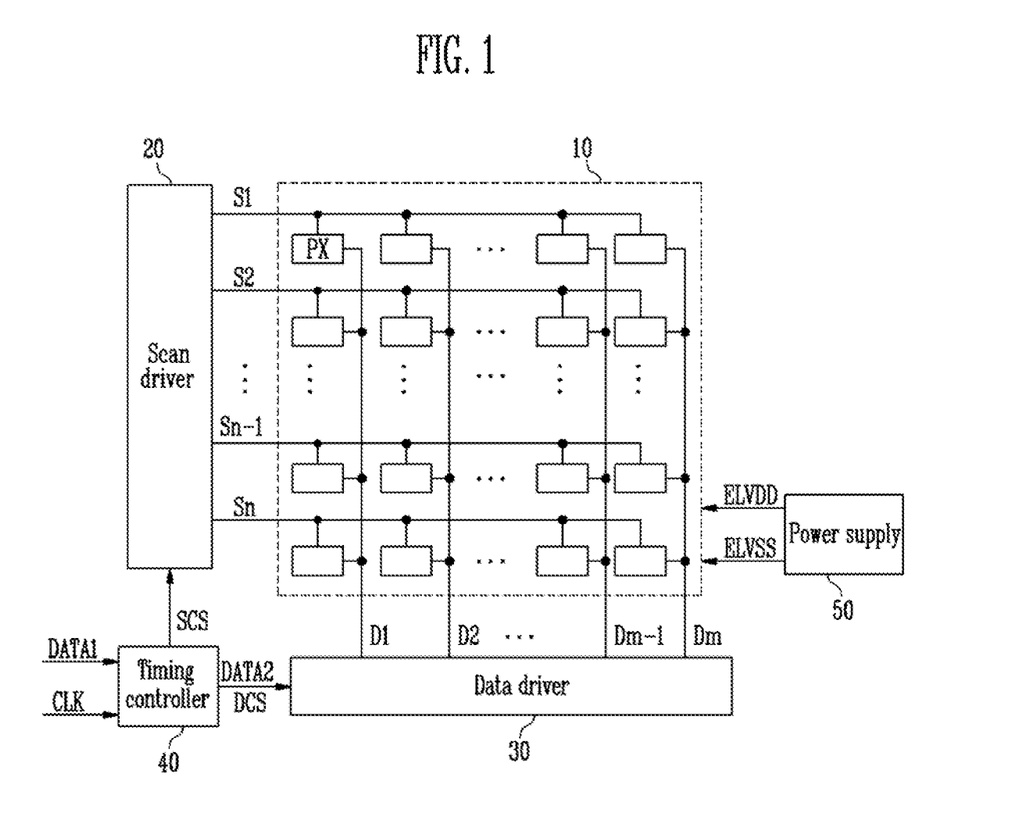
FIG. 1 is a schematic diagram illustrating a display device according to an exemplary embodiment of the present invention.

FIG. 1 is a schematic diagram illustrating a display device according to an exemplary embodiment of the present invention.

Referring to FIG. 1, a display device, according to an exemplary embodiment of the present invention, may include a pixel unit 10, a scan driver 20, a data driver 30, a timing controller 40, and a power supply 50.

The pixel unit 10 includes a plurality of pixels PX that are connected to a plurality of scan lines S1 to Sn and a plurality of data lines D1 to Dm. The plurality of pixels PX may be arranged in a matrix form. In driving the display device, the pixels PX are selected in units of horizontal lines corresponding to scan signals supplied from the scan lines S1 to Sn. The pixels PX selected by the scan signal emit light with luminance corresponding to data signals supplied from the data lines D1 to Dm. Various known structures may be applied to each pixel circuit of the pixels PX, and a detailed description of the pixel circuit will be omitted.

The scan driver 20 is connected to the scan lines S1 to Sn and the scan driver 20 generates a scan signal in response to a scan control signal SCS of the timing controller 40 and outputs the generated scan signal to the scan lines S1 to Sn. In an exemplary embodiment, the scan driver 20 may include a plurality of stage circuits and may sequentially supply the scan signals to the scan lines S1 to Sn. When the scan signals are sequentially supplied to the scan lines S1 to Sn, the pixels PX are selected in units of horizontal lines.

The data driver 30 is connected to the data lines D1 to Dm and the data driver 30 generates a data signal in response to a data control signal DCS of the timing controller 40 and the data driver 30 outputs the generated data signal to the data lines D1 to Dm. The data driver 30 converts digital image data DATA2 provided from the timing controller 40 into analog data signals, and outputs the analog data signals to the data lines D1 to Dm. The analog data signal output to the data lines D1 to Dm is input to the pixels PX of the horizontal line selected by the scan signal.

The timing controller 40 receives image data DATA1 and a clock signal CLK for controlling the display device. The timing controller 40 corrects the image data DATA1 to an image data DATA2 by rearranging an input image data DATA1 to fit an image display of the pixel unit 10 and the timing controller 40 transmits the corrected image data DATA2 to the data driver 30. In addition, the timing controller 40 may generate driving control signals SCS and DCS for controlling a driving of the scan driver 20 and the data driver 30 based on the clock signal CLK.

The power supply 50 supplies a first power ELVDD having a relatively high voltage and a second power ELVSS having a relatively low voltage to the pixel unit 10. The power supply 50 may supply the first power ELVDD and the second power ELVSS through respective power supply lines.

Figure 2A:
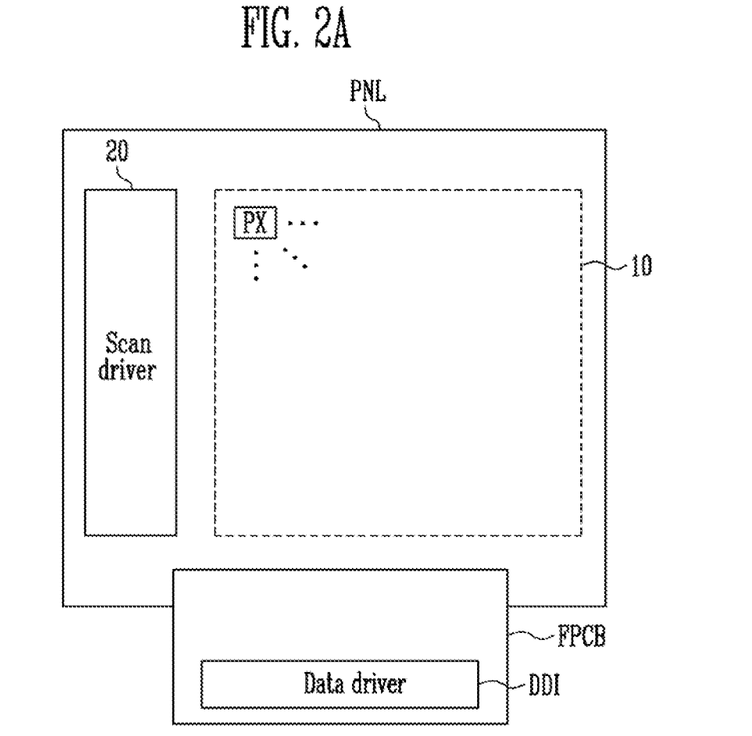
FIGS. 2A and 2B are schematic diagrams illustrating a display panel and a driving circuit according to an exemplary embodiment of the present invention.
Figure 2B:
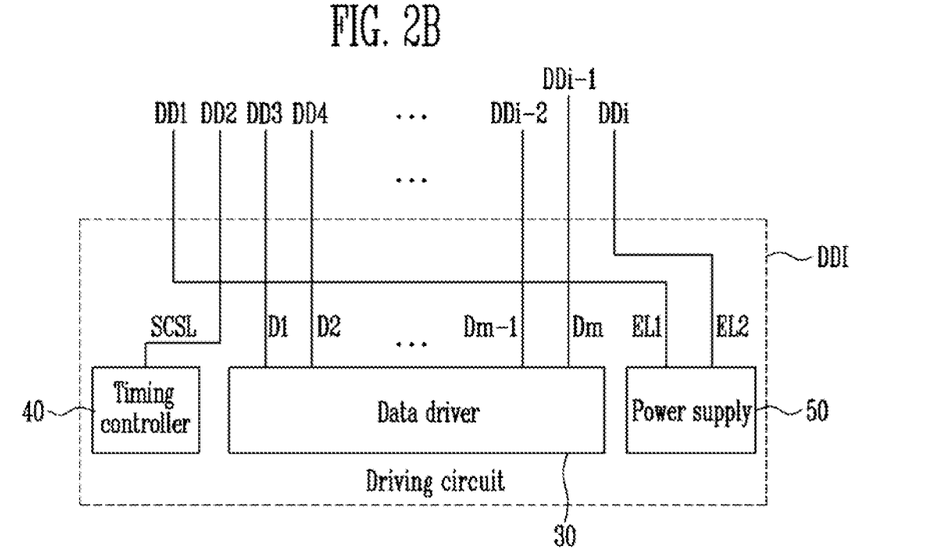

FIGS. 2A and 2B are schematic diagrams illustrating a display panel and a driving circuit according to an exemplary embodiment of the present invention.

Referring to FIGS. 2A and 2B, the display device, according to an exemplary embodiment of the present invention, includes a display panel PNL, a connector FPCB, and a driving circuit DDI.

The display panel PNL, according to the present exemplary embodiment, may include the above-described pixel unit 10 and the scan driver 20. The pixel unit 10 may be correspond to a display region of the display panel PNL and the scan driver 20 may be disposed at one or two side regions of the display panel PNL. The display panel PNL may be a flexible display panel in which at least a portion of the display panel is flexible.

In an exemplary embodiment of the present invention, the display panel PNL may be an organic light emitting display panel. However, the display panel is not limited thereto, and the display panel PNL may be implemented as a liquid crystal display panel, a plasma display panel, or another form of display panel.

The connector FPCB electrically connects the display panel PNL to the driving circuit DDI. The connector FPCB may be implemented as a flexible printed circuit board of a flexible film form.

In the present exemplary embodiment, the connector FPCB may be attached to an edge of the display panel PNL and the driving circuit DDI may be mounted on the connector FPCB.

In an exemplary embodiment of the present invention, the display panel PNL and the connector FPCB may be integrally formed. In this case, the connector FPCB may be a portion region of the display panel PNL.

The driving circuit DDI is electrically connected to the display panel PNL through driving lines DD1 to DDi and the driving circuit DDI supplies driving signals for driving the display panel PNL to the driving lines DD1 to DDi. The driving circuit DDI may be mounted on the connector FPCB in the form of an integrated circuit chip.

The driving circuit DDI may include the data driver 30, the timing controller 40, and/or the power supply 50 described above. In the present exemplary embodiment, the driving circuit DDI includes the data driver 30, the timing controller 40, and the power supply 50. The driving lines DD1 to DDi may include data lines D1 to Dm, a scan control line SCSL, and power lines EL1 and EL2 connected to the display panel PNL.

The timing controller 40 may transmit the scan control signal SCS through the scan control line SCSL. The power supply 50 may supply the first power ELVDD through the first power line EL1 and supply the second power ELVSS through the second power line EL2. Here, the scan control signal SCS may include a scan start signal and clock signals for driving the scan driver 20.

For example, the first driving line DD1 corresponds to the first power line EL1, and the i-th driving line DDi corresponds to the second power line EL2. In addition, the second driving line DD2 corresponds to the scan control line SCSL and the third to the (i−1)-th driving lines DD3 to DDi−1 correspond to the data lines D1 to Dm. However, the line structure of the present exemplary embodiment is illustrative and may have various modifications from the configurations shown in the figures and described herein.

Figure 3A:
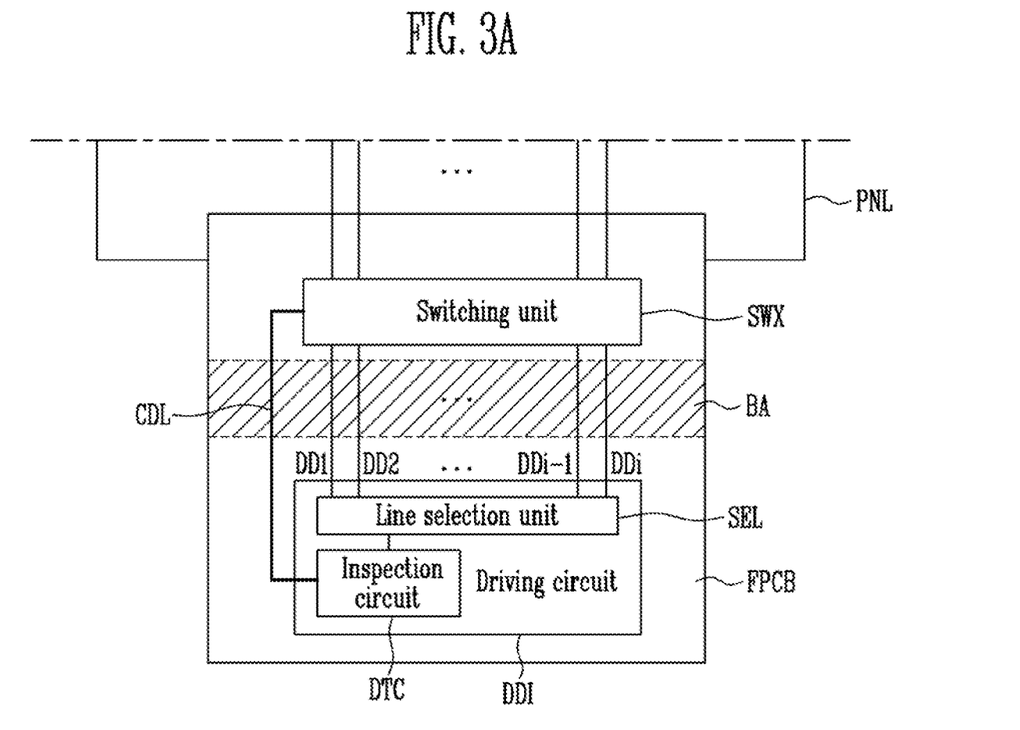
FIG. 3A is a plan view illustrating a connector according to an exemplary embodiment of the present invention.
Figure 3B:
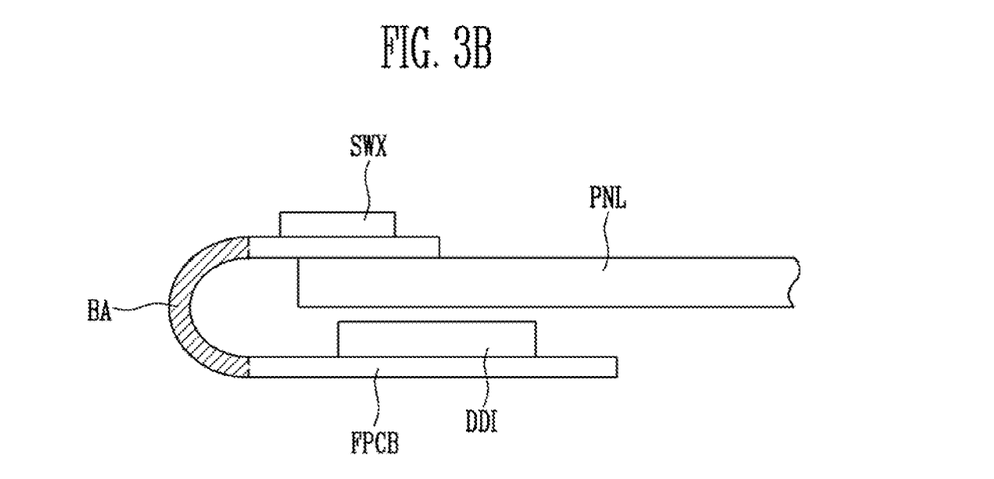
FIG. 3B is a cross-sectional view illustrating a state in which the connector shown in FIG. 3A is bent.

FIG. 3A is a plan view illustrating a connector according to an exemplary embodiment of the present invention and FIG. 3B is a cross-sectional view illustrating a state in which the connector shown in FIG. 3A is bent.

Referring to FIGS. 3A and 3B, the display device, according to an exemplary embodiment of the present invention, further includes an inspection line CDL, a switching unit SWX, a line selection unit SEL, and an inspection circuit DTC.

In the present exemplary embodiment, the inspection line CDL, the switching unit SWX, and the inspection circuit DTC may each be mounted on the connector FPCB, and the line selection unit SEL and the inspection circuit DTC may be integrated with the driving circuit DDI. However, the line selection unit SEL and the inspection circuit DTC may be separated from the driving circuit DDI.

The connector FPCB may include a bending region BA disposed between the display panel PNL and the driving circuit DDI. As shown in FIG. 3B, the connector FPCB may be bent to a back surface of the display panel PNL. Here, a bent portion of the connector FPCB corresponds to the bending region BA.

The driving lines DD1 to DDi disposed on the connector FPCB may extend from the driving circuit DDI via the bending region BA to the display panel PNL. Cracks may occur in some driving lines DD1 to DDi disposed in the bending region BA as a result of the bending of the bending region.

The inspection line CDL may be configured for detecting an abnormality such as cracks in the driving lines DD1 to DDi. At least one inspection line CDL may be formed, and there may be a plurality of inspection lines CDL. The inspection line CDL may be parallel to the driving lines DD1 to DDi and the inspection line CDL may be formed at the edge of the connector FPCB. The inspection line CDL may be formed of the same material and on the same layer as the driving lines DD1 to DDi.

A first end of inspection line CDL may be connected to the switching unit SWX, and a second end of inspection line CDL may be connected to the inspection circuit DTC. Here, the first end of the inspection line may include a plurality of nodes connected to switches of the switching unit SWX.

The switching unit SWX is disposed between the display panel PNL and the bending region BA and connects the driving lines DD1 to DDi and one end of the inspection line CDL. The switching unit SWX may connect the driving lines DD1 to DDi to the inspection line CDL at the same time under the control of the driving circuit DDI.

The line selection unit SEL selectively connects the driving lines DD1 to DDi to the inspection circuit DTC. The line selection unit SEL may sequentially connect the driving lines DD1 to DDi to the inspection circuit DTC. In this respect, the line selection unit SEL may operate as a multiplexer.

The inspection circuit DTC supplies a sensing signal to at least one of the driving lines DD1 to DDi connected to the inspection line CDL. The inspection circuit DTC may supply the sensing signal to the specific driving lines (e.g. any one of DD1 to DDi) selected by the line selection unit SEL.

The inspection circuit DTC is connected to the other end of the inspection line CDL and detects a sensing value corresponding to the sensing signal from the inspection line CDL. With the driving lines DD1 to DDi and inspection line CDL connected, the sensing signal may be fed back to the inspection circuit DTC via the specific driving line (e.g. any one of DD1 to DDi) and the inspection line CDL.

The inspection circuit DTC may determine whether there is an abnormality in the specific driving line (e.g. any one of DD1 to DDi) to which the sensing signal is supplied based on the sensing value. In an exemplary embodiment, when the sensing signals are sequentially supplied to the driving lines DD1 to DDi, the inspection circuit DTC may determine whether any of the driving lines DD1 to DDi is abnormal.

For example, when a crack inspection mode is performed to inspect whether any of the driving lines DD1 to DDi are cracked, the inspection circuit DTC may control the switching unit SWX to connect the driving lines DD1 to DDi to the inspection line CDL at the same time. The line selection unit SEL may sequentially connect the driving lines DDI to DDi to the inspection circuit DTC. The inspection circuit DTC may detect the sensing value corresponding to the sensing signal from the inspection line CDL while supplying the sensing signal, and then the inspection circuit DTC may determine whether each of the driving lines DD1 to DDi is cracked based on the sensing value.

As described above, cracks may occur in driving lines DD1 to DDi, especially within the bending region BA. When the cracks are present in the specific driving line (e.g. any one of DDI to DDi), an electrical characteristic value of the specific driving line (e.g. any one of DD1 to DDi) may be changed.

For example, a resistance of the specific driving line (e.g. any one of DD1 to DDi) in which cracks are present may increase. The inspection circuit DTC may determine that cracks have occurred when the resistance of the specific driving line (e.g. any one of DD1 to DDi) increases. The details of the inspection circuit DTC will be described later.

Figure 4:
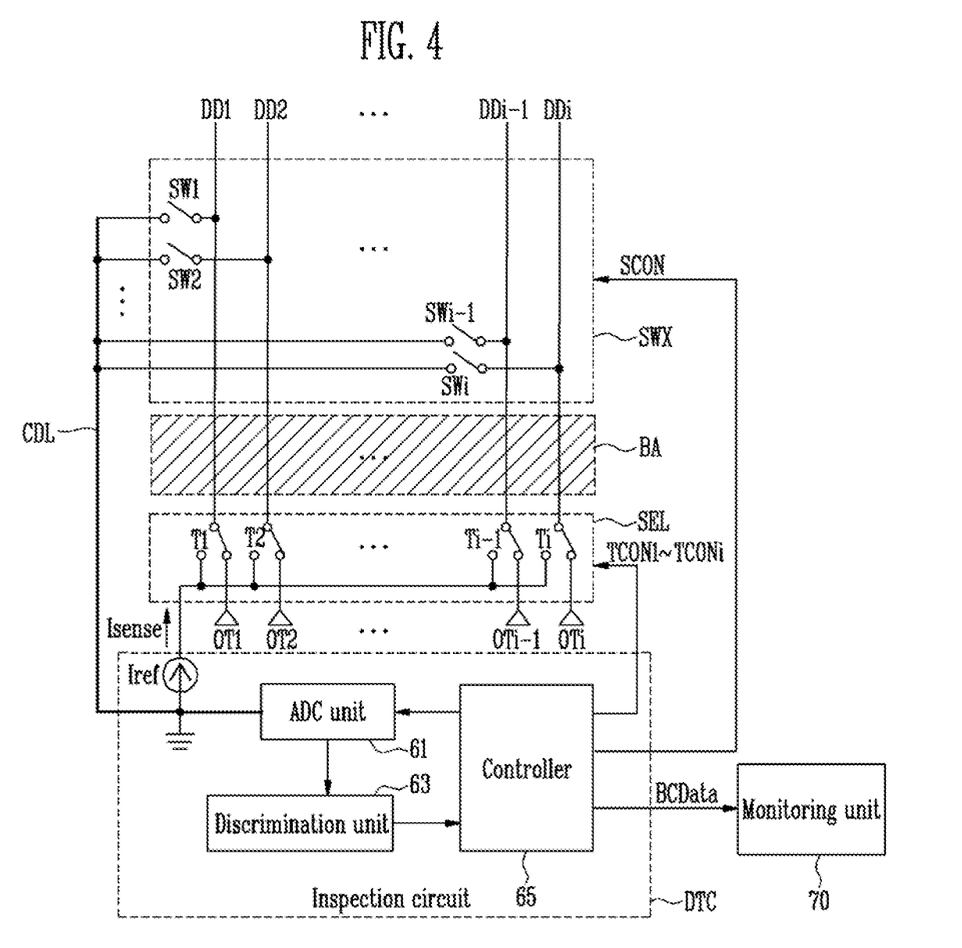
FIG. 4 is a detailed schematic diagram illustrating a switching unit and an inspection circuit according to an exemplary embodiment of the present invention.
Figure 5:
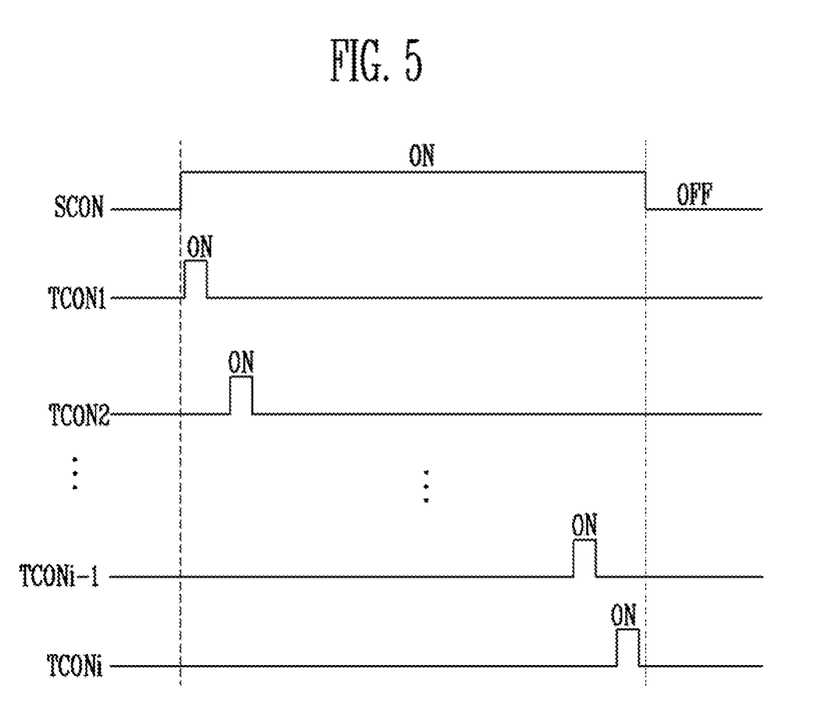
FIG. 5 is a waveform diagram illustrating a control method of a switching unit and a line selection unit according to an exemplary embodiment of the present invention.

FIG. 4 is a detailed schematic diagram of a switching unit and an inspection circuit according to an exemplary embodiment of the present invention and FIG. 5 is a waveform diagram illustrating a control method of a switching unit and a line selection unit.

Referring to FIG. 4, the switching unit SWX, according to an exemplary embodiment of the present invention, may include switches SW1 to SWi corresponding to the driving lines DD1 to DDi, respectively. For example, the switches SW1 to SWi may be implemented with thin film transistors formed on the connector FPCB. The switches SW1 to SWi may be an NMOS type transistor which is turned on by a switching control signal SCON having a high value.

The switching unit SWX may simultaneously connect the driving lines DD1 to DDi to the inspection line CDL in response to the switching control signal SCON of the inspection circuit DTC. According to an exemplary embodiment of the present invention, the switching unit SWX may connect some of the driving lines DD1 to DDi to the inspection line CDL. For example, the switching unit SWX may sequentially connect the driving lines DD1 to DDi to inspection line CDL.

The inspection circuit DTC, according to the present exemplary embodiment, may include a constant current source Iref, an analog-digital converter 61 (hereinafter referred to as an ADC UNIT), a discrimination unit 63 and a controller 65.

The inspection circuit DTC may supply the sensing signal Isense to at least one of the driving lines DD1 to DDi selected by the line selection unit SEL. The sensing signal Isense may be a current supplied from the constant current source Iref. The driving circuit DDI may stop supplying driving signals to the driving lines DD1 to DDi.

In an exemplary embodiment of the present invention, the line selection unit SEL may include switches T1 to Ti corresponding to the driving lines DD1 to DDi, respectively. The line selection unit SEL may sequentially connect the driving lines DD1 to DDi to the constant current source Iref in response to a selection control signals TCON1 to TCONi of the controller 65.

For example, the line selection unit SEL may block the connection of driving lines (DD1 to DDi) to driving signal output terminals OT1 to OTi (including source channel buffers, for example) for outputting the driving signals, and may sequentially connect the blocked driving lines DD1 to DDi to the constant current source Iref.

The ADC unit 61 converts a sensing value corresponding to the sensing signal Isense fed back to the inspection line CDL into a digital value. Here, the sensing value may be a current value and/or a voltage value corresponding to a resistance.

The discrimination unit 63 compares the sensing value provided from the ADC unit 61 with a preset reference value, generates a comparison result, and transmits the comparison result to the controller 65. Here, the reference value may be set to a current value and/or a voltage value indicative of the resistance of the driving lines DD1 to DDi measured in a normal state in which no abnormality such as cracks are present. In addition, the reference value may be a specific value or a predetermined range having a lower limit and an upper limit.

The controller 65 outputs crack data BCData for cracking of each of the driving lines DD1 to DDi according to the comparison result of the discrimination unit 63. The controller 65 may output the crack data BCData to the display panel PNL or a separate monitoring unit 70. For example, when the crack inspection mode is performed, the controller 65 may control the switching unit SWX and the line selection unit SEL to inspect the cracks of the driving lines DD1 to DDi. For example, the controller 65 may control the driving lines DD1 to DDi to be connected to the inspection line CDL simultaneously by outputting the switching control signal SCON to the switching unit SWX. The controller 65 may connect the driving lines DD1 to DDi to the constant current source Iref by outputting the selection control signals TCON1 to TCONi to the line selection unit SEL. For example, as shown in FIG. 5, the controller 65 may sequentially output the selection control signals TCON1 to TCONi while supplying the switching control signal SCON.

The controller 65 may determine whether cracks are present in the specific driving lines DD1 to DDi to which the sensing signal Isense is supplied, according to the comparison result of the discrimination unit 63. For example, the controller 65 may recognize in advance that the sensing signal Isense is supplied to the first driving line DD1 by outputting the first selection control signal TCON1. When the sensing value Isense is supplied to the first driving line DD1 and the sensing value is equal to or greater than the reference value, the controller 65 may determine that cracks have occurred in the first driving line DD1.

Figure 6:
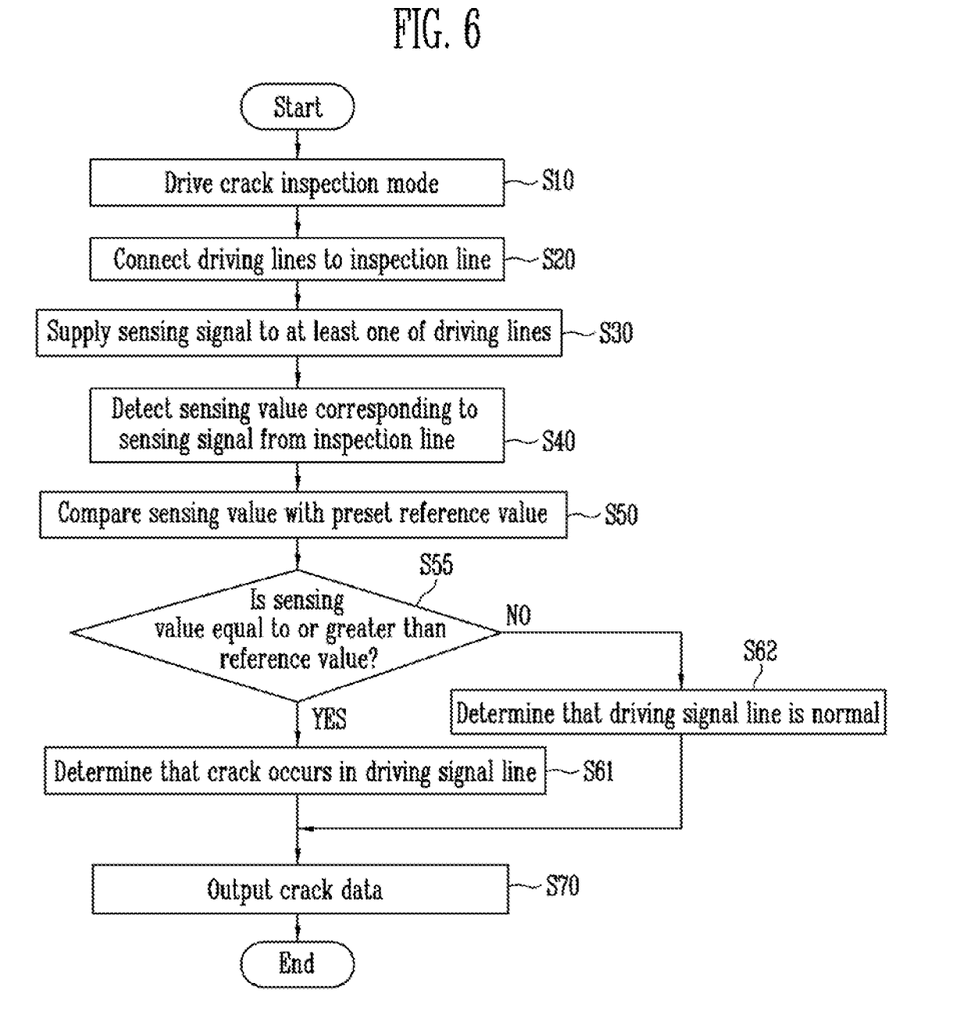
FIG. 6 is a flowchart illustrating a crack inspection method of a display device according to an exemplary embodiment of the present invention.

FIG. 6 is a flowchart showing a crack inspection method of a display device according to an exemplary embodiment of the present invention.

Referring to FIG. 6, in the crack inspection method of the display device, according to an exemplary embodiment of the present invention, first, a crack inspection mode is driven (S10).

When the crack inspection mode is performed, the switching unit SWX connects the driving lines DD1 to DDi to the inspection line CDL (S20). The switching unit SWX may simultaneously connect the driving lines DD1 to DDi to the inspection line CDL in response to the switching control signal SCON of the controller 65.

Then, the inspection circuit DTC supplies the sensing signal Isense to any one of the specific driving lines (any one of DD1 to DDi) selected by the line selection unit SEL (S30). The line selection unit SEL may sequentially connect the driving lines DD1 to DDi to the constant current source Iref in response to the selection control signals TCON1 to TCONi of the controller 65.

For example, with the driving lines DD1 to DDi connected to the inspection line CDL, the inspection circuit DTC sequentially supplies the sensing signal Isense to the driving lines DD1 to DDi.

The inspection circuit DTC supplies a sensing signal Isense to the driving lines DD1 to DDi and detects a sensing value corresponding to the sensing signal Isense through the inspection line CDL (S40). For example, the ADC unit 61 converts the sensing value corresponding to the sensing signal Isense fed back to the inspection line CDL into a digital value. Here, the sensing value may be a current value and/or a voltage value corresponding to a resistance.

Next, the inspection circuit DTC compares the sensing value with a preset reference value (S50). For example, the discrimination unit 63 compares the sensing value provided from the ADC unit 61 with a preset reference value, generates a comparison result, and transmits the comparison result to the controller 65.

In step S55, when the sensing value is equal to or greater than the reference value (Yes, Step S55), the controller 65 determines that cracks has occurred in the specific driving line (e.g. any one of DD1 to DDi) to which the sensing signal Isense is supplied (S61). The controller 65 may recognizes the specific driving lines (e.g. any one of DD1 to DDi) in advance by outputting the selection control signals TCON1 to TCONi.

For example, the controller 65 may recognize in advance that the sensing signal Isense is supplied to the first driving line DD1 by outputting the first selection control signal TCON1. When the sensing value Isense is supplied to the first driving line DD1 and the sensing value is equal to or greater than the reference value, the controller 65 may determine that cracks have occurred in the first driving line DD1.

In step S55, when the sensing value is less than the reference value (No, Step S55), the controller 65 determines that the specific driving line (e.g. any one of DD1 to DDi) is normal (S62). For example, when the sensing signal Isense is supplied to the first driving line DD1 and the sensing value is less than the reference value, the controller 65 may determine that the first driving line DD1 is normal.

The inspection circuit DTC determines whether each of the driving lines DD1 to DDi is cracked, and then outputs crack data BCData representing the determination result (S70). The controller 65 may output the crack data BCData to the display panel PNL or a separate monitoring unit 70.

According to an exemplary embodiment of the present invention, the driving lines DD1 to DDi are connected to the inspection line CDL and the sensing signals are supplied to at least one of the driving lines DD1 to DDi. It is thereby determined whether the driving lines DD1 to DDi are abnormal based on the sensing value detected from the inspection line CDL. For example, for each of the driving lines it is possible to inspect for the presence of cracks within a bending region of a connector.

The technical idea of the present invention has been specifically described with respect to exemplary embodiments thereof, but it should be noted that the foregoing embodiments are provided only for illustration and the present invention may include other embodiments not described herein. In addition, it will be understood by those skilled in the art that various changes in form and details may be made therein without departing from the scope of the present disclosure.

What is claimed is:
1. A display device, comprising:
a display panel including a plurality of pixels;
a driving circuit;

a plurality of driving lines electrically connecting the driving circuit to the display panel and supplying driving signals from the driving circuit to the display panel;

a connector connecting the display panel to the driving circuit, the connector including a bending area through which the plurality of driving lines pass;

a switching unit connecting each of the plurality of driving lines to a first end of an inspection line;

an inspection circuit connected to a second end of the inspection line; and a line selection unit configured to selectively connect one or more of the plurality of driving lines to the inspection circuit, wherein the inspection line is configured to connect each of the plurality of driving lines, at a first side of the bending area, to the inspection circuit, at a second side of the bending area, and the line selection unit is configured to supply each of the plurality of driving lines with a constant current at the second side of the bending area.

2. The display device of claim 1, wherein the switching unit is disposed between the display panel and the bending area.

3. The display device of claim 1, wherein the switching unit includes a plurality of switches, each of which corresponding to each of the plurality of driving lines.

4. The display device of claim 1, wherein one or more of the driving circuit, the switching unit, and the inspection circuit are mounted on the connector.

5. The display device of claim 1, wherein the inspection circuit supplies a sensing signal to at least one of the plurality of driving lines and determines whether the at least one driving line is abnormal based on a sensing value corresponding to the sensing signal detected from the inspection line.

6. The display device of claim 5, wherein the sensing signal is the constant current and the constant current is supplied from a constant current source.

7. The display device of claim 6, wherein the line selection unit is configured to sequentially connect each of the plurality of driving lines to the constant current source.

8. The display device of claim 5, wherein the inspection circuit includes:

an analog-digital converter (ADC) configured to convert the sensing value into a digital value;

a discrimination unit configured to compare the sensing value with a previously stored reference value; and a controller which outputs crack data corresponding to whether each of the plurality of driving lines is cracked according to a result of a comparison in the discrimination unit.

9. The display device of claim 8, wherein the controller controls the switching unit to simultaneously connect each of the plurality of driving lines to the inspection line.

10. The display device of claim 8, wherein the controller transmits the crack data to the display panel or a separate monitoring unit.

11. The display device of claim 1, further comprising:

a scan driver configured to supply a plurality of scan signals to a plurality of scan lines connected to the plurality of pixels;

a data driver configured to supply a plurality of data signals to a plurality of data lines connected to the plurality of pixels; and a power supply configured to supply power to the plurality of pixels.

12. The display device of claim 11, wherein the plurality of driving lines includes the plurality of data lines and a power line that is configured to supply the power.

13. The display device of claim 11, wherein: the display panel includes the scan driver, and the driving circuit includes the data driver and the power supply.

14. A crack inspection method of a display device, comprising:

connecting a plurality of driving lines at a first side of a bending region of a connector to an inspection circuit at a second side of the bending region, using an inspection line, the connector connecting a display panel to a driving circuit;

supplying a constant current to each of the plurality of driving lines connected to the inspection line from the second side of the bending region, using a line selection unit;

detecting a sensing value corresponding to a sensing signal from the inspection line;

comparing the detected sensing value with a stored reference value; and determining whether each of the plurality of driving lines is abnormal based on a result of the comparing.

15. The crack inspection method of claim 14, wherein each of the plurality of driving lines is simultaneously connected to the inspection line.

16. The crack inspection method of claim 14, further comprising outputting crack data corresponding to whether each of the plurality of driving lines is cracked.

17. A display device comprising:

a display panel comprising a plurality of pixels;

a scan driver supplying a plurality of scan signals to the plurality of pixels along a plurality of scan lines; and a data driver supplying a plurality of data signals to the plurality of pixels along a plurality of data lines, the data driver being disposed on a connector that includes a bending portion though which each of the plurality of data lines passes, wherein the connector further includes a driving circuit configured to generate the plurality of data signals, an inspection circuit configured to determine whether each of the plurality of data lines j cracked within the bending portion, and a switching unit for connecting the inspection circuit to each of the plurality of data lines, wherein the connector further includes an inspection line connecting the inspection circuit to the switching unit, the inspection line passing through the bending portion, and wherein the inspection line is configured to connect each of the plurality of data lines, at a first side of the bending portion, to the inspection circuit, at a second side of the bending portion, and a line selection unit is configured to supply each of the plurality of data lines with a constant current at the second side of the bending portion.

* * * * *